US008946819B2

(12) United States Patent
Zhang et al.

(10) Patent No.: US 8,946,819 B2
(45) Date of Patent: Feb. 3, 2015

(54) SILICON-ON-INSULATOR INTEGRATED CIRCUITS WITH LOCAL OXIDATION OF SILICON AND METHODS FOR FABRICATING THE SAME (71) Applicant: GLOBALFOUNDRIES Singapore Pte. Ltd., Singapore (SG)

(72) Inventors: Shaoqiang Zhang, Singapore (SG); Purakh Raj Verma, Singapore (SG); Guan Huei See, Singapore (SG); Youzhou Hu, Singapore (SG); Wenli Liu, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 37 days.

(21) Appl. No.: 13/889,644

(22) Filed: May 8, 2013

(65) Prior Publication Data
US 2014/0332887 A1 Nov. 13, 2014

(51) Int. Cl.
*H01L 27/12* (2006.01)
*H01L 29/78* (2006.01)
*H01L 29/66* (2006.01)

(52) U.S. Cl.
CPC .......... *H01L 29/78* (2013.01); *H01L 29/66477* (2013.01)
USPC ....................................................... 257/347

(58) Field of Classification Search
USPC ........................... 438/303; 257/347, 350, 446
See application file for complete search history.

(56) References Cited

U.S. PATENT DOCUMENTS

| 6,177,708 | B1 | 1/2001 | Kuang et al. |
| 6,204,532 | B1 * | 3/2001 | Gambino et al. ............. 257/329 |
| 6,252,281 | B1 * | 6/2001 | Yamamoto et al. ........... 257/350 |
| 6,258,641 | B1 * | 7/2001 | Wong et al. .................... 438/199 |
| 6,274,907 | B1 * | 8/2001 | Nakagawa .................... 257/354 |
| 6,316,808 | B1 | 11/2001 | Smith, III |
| 6,320,225 | B1 | 11/2001 | Hargrove et al. |
| 6,344,671 | B1 | 2/2002 | Mandelman et al. |
| 6,348,714 | B1 | 2/2002 | Lin et al. |
| 6,359,312 | B1 | 3/2002 | Komatsu |
| 6,387,739 | B1 | 5/2002 | Smith, III |
| 6,963,113 | B2 | 11/2005 | Ang et al. |
| 8,507,989 | B2 * | 8/2013 | Khakifirooz et al. ......... 257/347 |
| 2009/0315138 | A1 | 12/2009 | Chang et al. |
| 2010/0102388 | A1 * | 4/2010 | Levin et al. ................... 257/343 |
| 2012/0012931 | A1 | 1/2012 | Chen et al. |
| 2013/0146959 | A1 * | 6/2013 | Cheng et al. .................. 257/310 |
| 2014/0203364 | A1 * | 7/2014 | Tsunomura et al. .......... 257/347 |

* cited by examiner

Primary Examiner — Thao P Le
(74) Attorney, Agent, or Firm — Ingrassia Fisher & Lorenz, P.C.

(57) ABSTRACT

Silicon-on-insulator integrated circuits with local oxidation of silicon and methods for fabricating the same are provided. An integrated circuit includes a semiconductor substrate and a plurality of shallow trench isolation (STI) regions, each extending at least a first depth below an upper surface of the semiconductor substrate. The STI regions electrically isolate devices fabricated in the semiconductor substrate. The integrated circuit further includes a transistor that includes source and drain regions located in the semiconductor substrate, a gate dielectric layer located between the source and drain regions, and a local oxide layer located in a second portion of the semiconductor substrate and extending a second depth below the upper surface of the semiconductor substrate. The first depth is greater than the second depth. Still further, the integrated circuit includes a first gate electrode that extends over the gate dielectric layer and the local oxide layer.

20 Claims, 6 Drawing Sheets

SILICON-ON-INSULATOR INTEGRATED CIRCUITS WITH LOCAL OXIDATION OF SILICON AND METHODS FOR FABRICATING THE SAME

TECHNICAL FIELD

The technical field generally relates to integrated circuits and method for fabricating integrated circuits, and more particularly relates to silicon-on-insulator integrated circuits with local oxidation of silicon (LOCOS) and methods for fabricating the same.

BACKGROUND

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed above a substrate including a crystalline semiconductor layer. A MOS transistor, irrespective of whether an N-channel transistor or a P-channel transistor is considered, includes so-called PN junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on, among other things, the distance between the source and drain regions, which is also referred to as channel length. Therefore, reducing the feature sizes, and in particular the gate length, of field effect transistors has been an important design criterion.

In view of further enhancing performance of transistors, in addition to other advantages, the SOI (semiconductor- or silicon-on-insulator) architecture has continuously been gaining in importance for manufacturing MOS transistors due to their characteristics of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. This configuration provides significant advantages, but also gives rise to a plurality of issues.

In SOI fabrication techniques, devices usually are fabricated in a thin silicon film, and a buried oxide layer (BOX) is disposed between the device and the substrate to separate them. Compared to traditional bulk silicon, SOI technology has many advantages, such as reduced parasitic capacitance, which leads to higher speed and less power consumption, full dielectric isolation of the SOI CMOS device, which eliminates the occurrence of bulk-silicon CMOS device parasitic latch-up effects and makes SOI devices have superior performances including high integration density and good anti-irradiation properties.

In bulk silicon MOSFETs, the bottom of the bulk silicon can be connected to a fixed potential. However, in an SOI MOSFET, the body is electrically isolated from the bottom of the substrate. This "floating body" effect result in drain current "kink" effect, abnormal threshold slope, low drain breakdown voltage, drain current transients, and noise overshoot. The "kink" effect originates from impact ionization. When an SOI MOSFET is operated at a large drain-to-source voltage, channel electrons cause impact ionization near the drain end of the channel. Holes build up in the body of the device, raising body potential and thereby raising threshold voltage. This increases the MOSFET current causing a "kink" in the current vs. voltage (I-V) curves.

Figure 1:
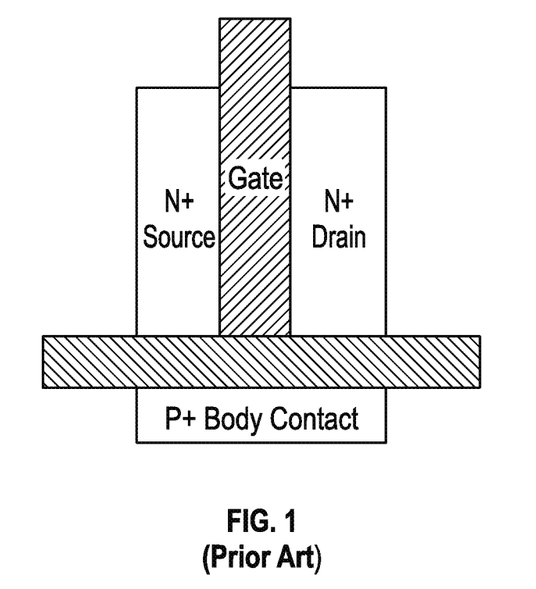
FIGS. 1 and 2 are top and cross-sectional views, respectively, of an SOI integrated circuit of the prior art.
Figure 2:
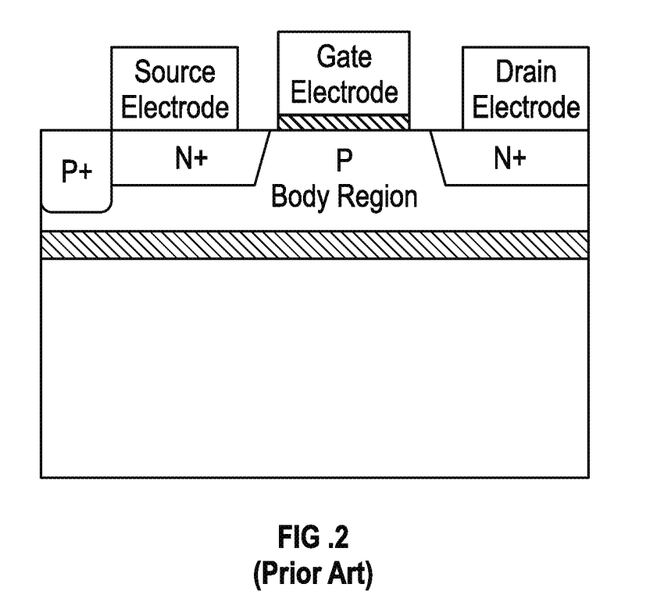

In order to resolve the undesirable effects caused by this floating body configuration of conventional SOI MOS, a method of body contacting is usually adopted to connect the "body" to a fixed electric potential such as the source region or the ground. Referring to FIGS. 1 and 2, in the traditional T-type gate structure body-contact, the $P^+$ implantation region formed in one side of the T-type gate is contacted to the P-type body region. During the operation of the MOS devices, the carriers accumulated in the body region are released via flowing through the $P^+$ channel to reduce electric potential of the body region. However, there are still some disadvantages of this T-type configuration such as a complex manufacturing process, an increased parasitic effect, degraded electric properties, and increased device area.

Accordingly, it is desirable to provide improved SOI integrated circuits and methods for fabricating the same that do not suffer from reduced threshold voltages or leakage currents. Moreover, it is desirable to provide SOI integrated circuits and methods for fabricating the same that are simple to manufacture and occupy a relative small area on the SOI substrate. Furthermore, other desirable features and characteristics of the present disclosure will become apparent from the subsequent detailed description of the disclosure and the appended claims, taken in conjunction with the accompanying drawings and this background of the disclosure.

BRIEF SUMMARY

Silicon-on-insulator integrated circuits with local oxidation of silicon and methods for fabricating the same are provided. In accordance with one embodiment, an integrated circuit includes a semiconductor substrate and a plurality of shallow trench isolation (STI) regions, each extending at least a first depth below an upper surface of the semiconductor substrate. The STI regions electrically isolate devices fabricated in the semiconductor substrate. The integrated circuit further includes a transistor that includes source and drain regions located in the semiconductor substrate, a gate dielectric layer located between the source and drain regions, and a local oxide layer located in a second portion of the semiconductor substrate and extending a second depth below the upper surface of the semiconductor substrate. The first depth is greater than the second depth. Still further, the integrated circuit includes a first gate electrode that extends over the gate dielectric layer and the local oxide layer.

In accordance with another embodiment, a method of fabricating an integrated circuit includes forming a plurality of shallow trench isolation (STI) regions in a semiconductor substrate, each extending at least a first depth below an upper surface of the semiconductor substrate, forming a gate dielectric layer between source and drain regions of the semiconductor substrate, and oxidizing a second portion of the semiconductor substrate, thereby forming a local oxide region that extends a second depth below an upper surface of the semiconductor substrate. The first depth is greater than the second depth. Further, the method includes forming a first gate electrode over the gate dielectric layer and the local oxide region.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description.

The various embodiments set forth herein provide SOI integrated circuits with local oxidation of silicon and methods for fabricating the same. The disclosed embodiments allow for the fabrication of SOI integrated circuits that require fewer processes to complete and occupy less space on the silicon chip that designs known in the prior art.

Figure 3:
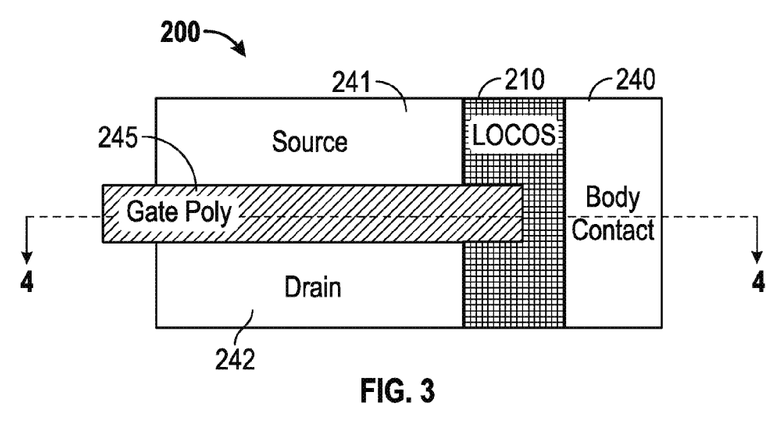
FIGS. 3, 4 and 5 are top, cross-sectional, and perspective views, respectively, of an SOI integrated circuit in accordance with various embodiments of the present disclosure.
Figure 4:
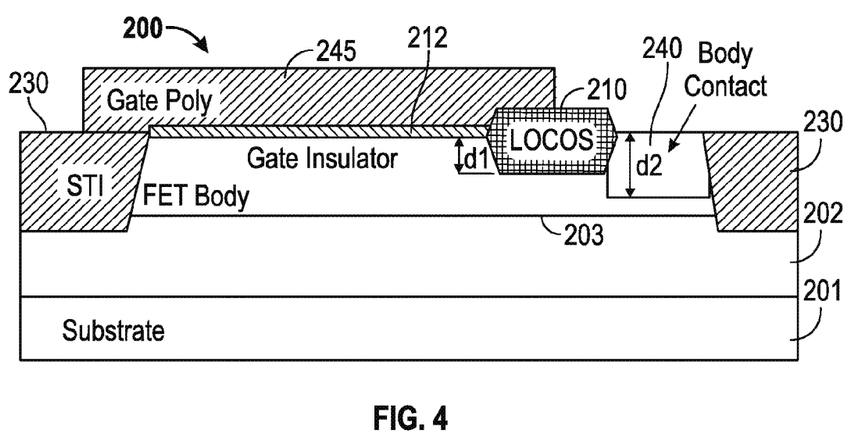
Figure 5:
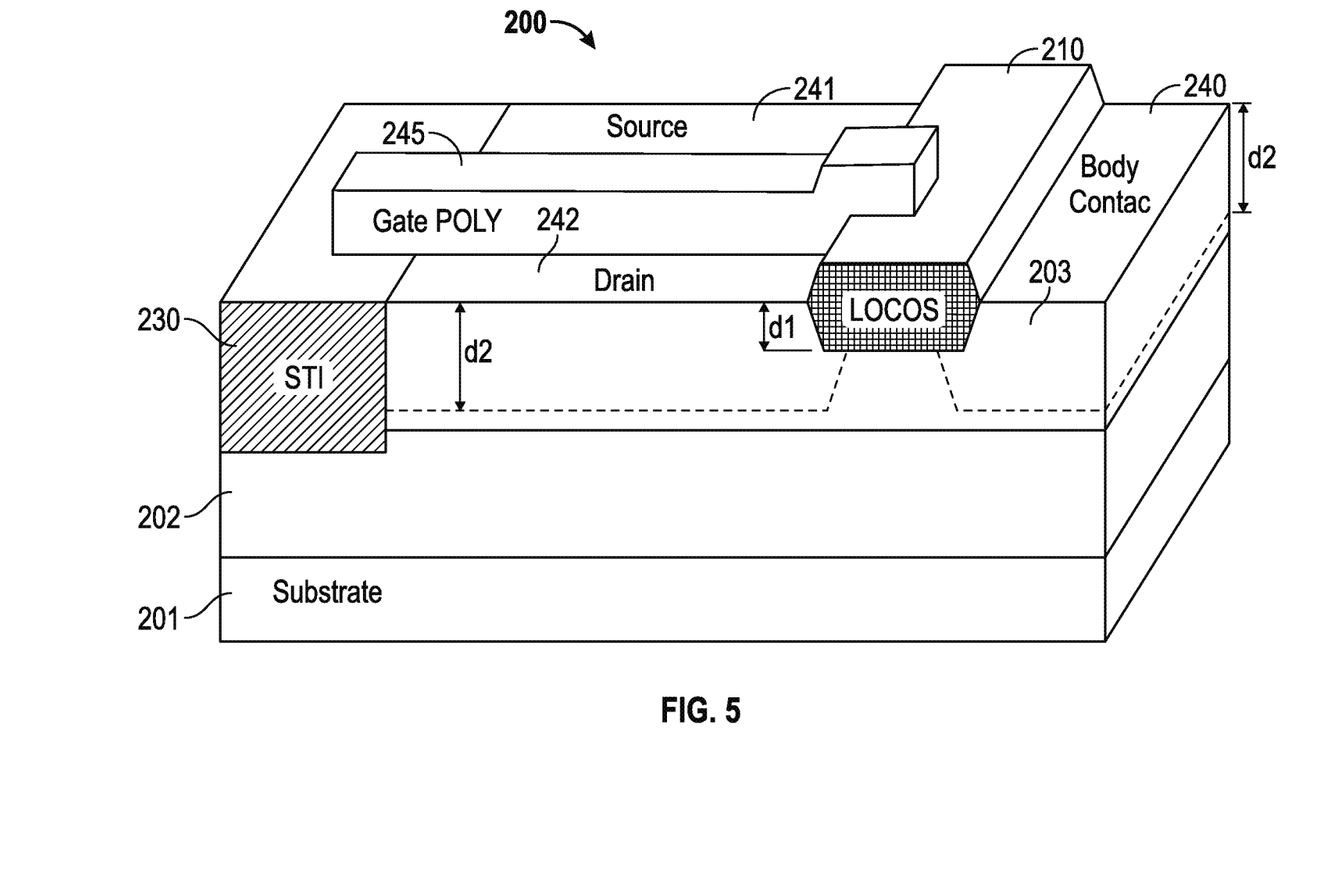

FIGS. 3, 4 and 5 are top, cross-sectional, and perspective views, respectively, of an SOI integrated circuit in accordance with various embodiments of the present disclosure. As described in more detail below, the structure of FIGS. 3, 4, and 5 can be fabricated using a process that is compatible with a conventional deep sub-micron CMOS process. Transistor 200 (and other circuit elements fabricated on the same substrate) is isolated by field isolation regions 230. In the illustrated embodiments, field isolation regions 230 are shallow trench isolation (STI) regions that extend below the surface of substrate 201 to a depth of about 3500 Angstroms, into the buried oxide layer 202.

Transistor 200 is fabricated in a p-type body region 203, which in turn, is fabricated over a buried oxide layer 202. Transistor 200 includes P+ body contact region 240, N+ source contact region 241, N+ drain contact region 242, gate dielectric layer 212, local oxide region (LOCOS) 210, and gate electrode 245. Local oxide region 210 only extends a shallow depth (d1) below the upper surface of the substrate. The shallow depth d1 is significantly less than the depth of field isolation regions 230. In one embodiment, the depth d is less than or equal to about 400 Angstroms. Local oxide region 210 does not extend to the buried oxide layer 202. The local oxide region 210 separates the source region 241 and the drain region 242 from the body contact region 240. The local oxide region extends above the surface of the substrate. A portion of the gate electrode 245 extends over the local oxide region 210. Thus, the gate electrode 245 is raised in the region thereof over the local oxide region 210. A field isolation region 230 is disposed adjacent the source region 241 and the drain region 242, opposite the local oxide region 210. Another field oxide region 230 is disposed adjacent the body oxide region 240, opposite the local oxide region 210. Source 241, drain 242, and body contact 240 regions extend to a depth d2 that is deeper than d1, but does not extend to the buried oxide layer 202.

The gate electrode has a length and a width, wherein the length of the gate electrode 245 is greater than the width of the gate electrode 245. The local oxide layer 210 has a length and a width, wherein the length of the local oxide layer 210 is greater than the width of the local oxide layer 210. The length of the gate electrode 245 extends perpendicular to the length of the local oxide layer 210. The local oxide layer 210 also extends above the upper surface of the semiconductor substrate. The source region 241 has a length and a width, wherein the length of the source region 241 is greater than the width of the source region 241, and wherein the length of the source region 241 extends parallel to the length of the gate electrode 245. The drain region 242 has a length and a width, wherein the length of the drain region 242 is greater than the width of the drain region 242, and wherein the length of the drain region 242 extends parallel to the length of the gate electrode 245. The body contact region 240 has a length and a width, wherein the length of the body contact region 240 is greater than the width of the body contact region 240, and wherein the length of the body contact region 240 extends parallel to the length of the local oxide layer 210.

Both the source 241 and the drain 242 regions are adjacent to the one of the plurality of STI regions 230. Both the source 241 and the drain 242 regions are adjacent to the local oxide layer 210. The gate dielectric layer 212 extends between the local oxide layer 210 and the one of the plurality of STI regions 230.

The fabrication of transistor 200 in accordance with one embodiment of the present disclosure will now be described. FIGS. 6-12 illustrate, in cross section, method steps for forming a portion of a transistor 200 as part of a silicon-on-insulator CMOS integrated circuit in accordance with an embodiment of the disclosure. Although the term "MOS device" properly refers to a device having a metal gate electrode and an oxide gate insulator, that term will be used throughout to refer to any semiconductor device that includes a conductive gate electrode (whether metal or other conductive material) that is positioned over a gate insulator (whether oxide or other insulator) which, in turn, is positioned over a semiconductor substrate. In these illustrative embodiments only a small portion of the CMOS integrated circuit is illustrated. Various steps in the manufacture of CMOS devices are well known and so, in the interest of brevity, many conventional steps will only be mentioned briefly herein or will be omitted entirely without providing the well-known process details. Although in this illustrative embodiment the integrated circuit is described as a CMOS circuit, the disclosure is also applicable to the fabrication of a single channel type MOS circuit.

Figure 6:
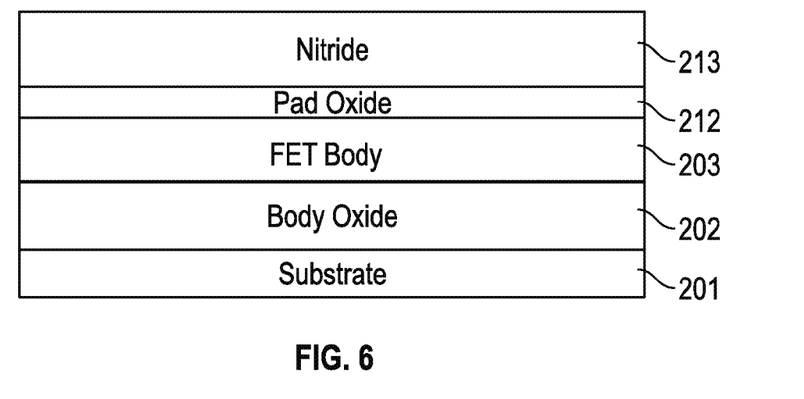
FIGS. 6-12 schematically illustrate, in cross section, method steps, in accordance with various embodiments, for fabricating the SOI integrated circuit shown in FIGS. 3-5.

As illustrated in FIG. 6, the method in accordance with one embodiment of the disclosure begins by providing a semiconductor substrate. The semiconductor substrate is preferably a silicon substrate with a monocrystalline silicon layer 203 formed overlying a monocrystalline silicon carrier substrate 201. As used herein, the terms "silicon layer" and "silicon substrate" will be used to encompass the relatively pure or lightly impurity doped monocrystalline silicon materials typically used in the semiconductor industry as well as silicon admixed with other elements such as germanium, carbon, and the like to form substantially monocrystalline semiconductor material. For ease of description, but without limitation, the semiconductor materials will generally be referred to herein as silicon materials. Monocrystalline silicon layer 203 will be used in the formation of N-channel and P-channel MOS transistors. Monocrystalline silicon substrate 201 provides a support for monocrystalline silicon layer 203. Monocrystalline silicon layer 203 is bonded to monocrystalline silicon carrier substrate 201 by well-known wafer bonding and thinning techniques with a dielectric insulating layer 202 separating monocrystalline silicon layer 203 from monocrystalline carrier substrate 201. The monocrystalline silicon layer is thinned to a thickness of about 50 nm to about 300 nanometers (nm) depending on the circuit function being implemented. Both the monocrystalline silicon layer 203 and the monocrystalline silicon carrier substrate 201 preferably have a resistivity of at least about 1-35 Ohms per square. In accordance with one embodiment of the disclosure thin silicon layer 203 is impurity doped P-type and monocrystalline carrier substrate 201 is impurity doped P-type. Dielectric insulating layer 202, typically silicon dioxide, preferably has a thickness of about 50 nm to about 200 nm.

As one alternative to the wafer bonding technique, the monocrystalline semiconductor substrate can be formed by the SIMOX process. The SIMOX process is a well-known process in which oxygen ions are implanted into a sub-surface region of monocrystalline silicon substrate 201. The monocrystalline silicon substrate and the implanted oxygen are subsequently heated to form a sub-surface silicon oxide dielectric layer 202 that electrically isolates the upper portion of the substrate, SOI layer 203, from the remaining portion of monocrystalline silicon substrate 201. The thickness of SOI layer 203 is determined by the energy of the implanted ions. Regardless of the method used to form the SOI layer, dielectric layer 202 is commonly referred to as a buried oxide or "BOX" and will so be referred to herein.

As illustrated in FIG. 6, a silicon oxide ($SiO_2$) Pad oxide layer 212 is thermally grown over the upper surface of the semiconductor structure. A sacrificial silicon nitride ($SiN_4$) layer 213 is then deposited over silicon oxide layer 212 using a standard chemical vapor deposition (CVD) process. In the described embodiment, silicon oxide layer 212 has a thickness of about 80 Angstroms and silicon nitride layer 213 has a thickness in the range of about 500 to 2000 Angstroms.

Figure 7:
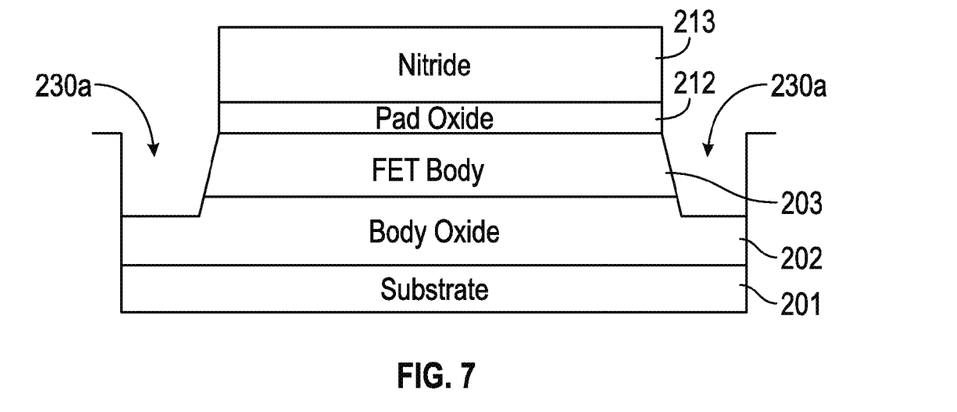
Figure 8:
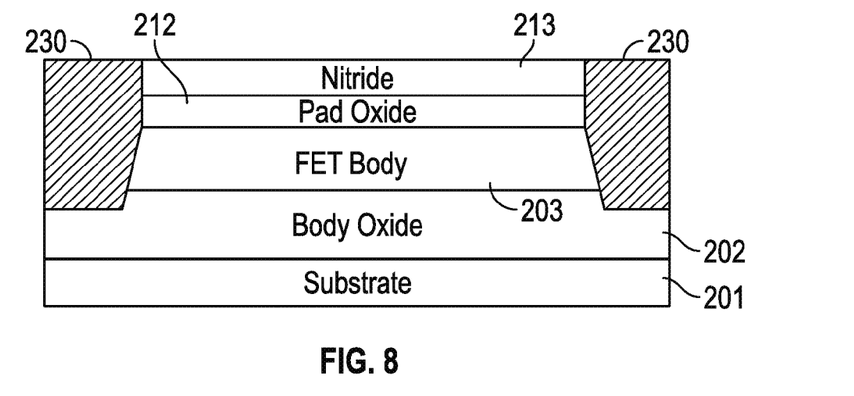

As shown in FIGS. 7 and 8, field isolation regions 230 are then fabricated at the upper surface of the resulting semiconductor structure. In the illustrated example, field isolation regions 230 are shallow trench isolation (STI) regions, which are formed using conventional CMOS processing steps. In the described example, STI regions 230 have a depth of about 3500 Angstroms, although other depths are possible. The depth extends into the buried oxide layer 202. Field isolation regions 230, in conjunction with the buried oxide layer 202, thus electrically isolate the illustrated portion of substrate layer 203.

FIG. 7 illustrates the patterning and etching used to form field isolation region openings or "trenches" 230a, whereas FIG. 8 illustrates the deposition of, for example, an oxide into the openings 230a to form field isolation regions 230. More particularly, as shown in FIG. 7, an opening 230a is formed through silicon oxide layer 212, silicon nitride layer 213, and substrate layer 203. This opening 230a is created by: forming a photoresist mask (not shown) over silicon nitride sacrificial layer 213, wherein the photoresist mask has an opening which exposes the region where opening 230a is subsequently formed; performing a dry etch through the opening in the photoresist mask, thereby creating opening 230a, and then removing the photoresist mask. The location of opening 230a is selected to correspond with the desired location of field isolation region 230, which is deposited using standard deposition procedures as shown in FIG. 8. CMP may be used to planarize the nitride layer 213 and the field isolation regions 230.

Figure 9:
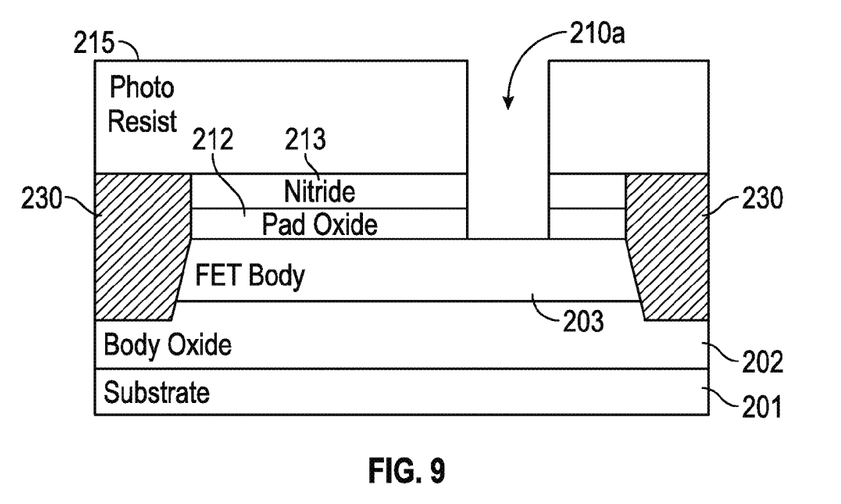

Referring now to FIG. 9, the figure illustrates the patterning and etching used to form local oxide region 210. More particularly, an opening 210a is formed through silicon oxide layer 212 and silicon nitride layer 213. This opening 210a is created by: forming a photoresist mask 215 over silicon nitride sacrificial layer 213, wherein the photoresist mask has an opening which exposes the region where opening 230a is subsequently formed; performing a dry etch through the opening in the photoresist mask, thereby creating opening 210a, and then removing the photoresist mask 215. The location of opening 210a is selected to correspond with the desired location of local oxide region 210, which can be grown using known thermal oxide growth techniques, discussed below.

Figure 10:
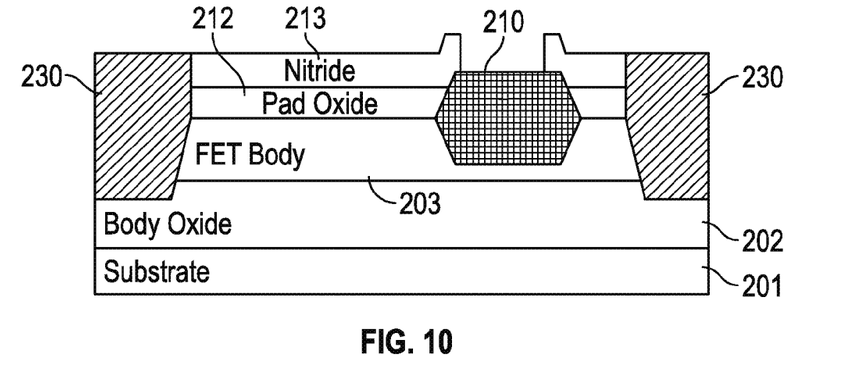

As illustrated in FIG. 10, a thermal oxidation step is performed to form a thin LOCOS isolation layer 210 on the portion of substrate layer 203 exposed through opening 210a. In the described embodiment, thin LOCOS isolation layer 210 has a total thickness of about 800 Angstroms. Thus, thin LOCOS isolation layer 210 extends about 400 Angstroms above and below the upper surface level of the substrate layer 203. In one embodiment of the present disclosure, thin LOCOS isolation layer 210 has a thickness in the range of about 400 to 1000 Angstroms. In other embodiments, the thermal oxidation step is controlled, such that the thin LOCOS isolation layer 210 has other thicknesses. In a particular embodiment, thin LOCOS isolation layer 210 has a thickness less than 800 Angstroms, such that this layer 210 does not adversely affect the shape of the resulting dielectric structure. It is important to note that the thin LOCOS isolation layer 210 has thickness that is substantially less than the thickness of STI regions 230.

Figure 11:
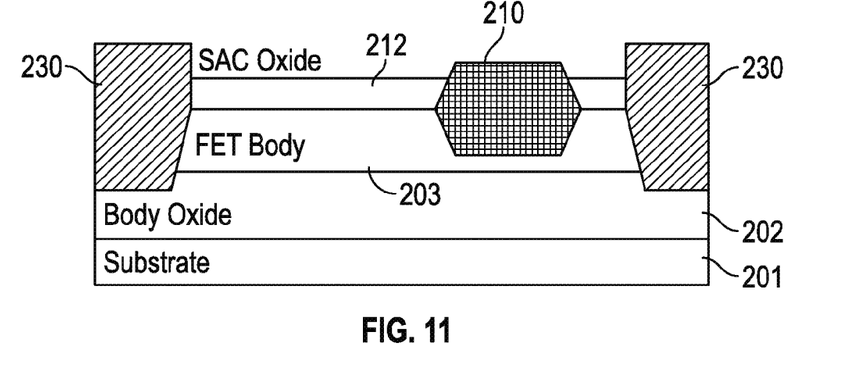

As shown in FIG. 11, silicon nitride layer 213 is removed by performing an etch with hot phosphoric acid. This etch is highly selective to silicon oxide, and does not remove thin LOCOS isolation region 210 or gate dielectric region 212. Note that the exposed upper surface of gate dielectric region 212 is partially removed during this etch, such that the thickness of gate dielectric region 212 is reduced. However, the controlled nature of the etch allows the final thickness of gate dielectric region 212 to be precisely controlled.

Figure 12:
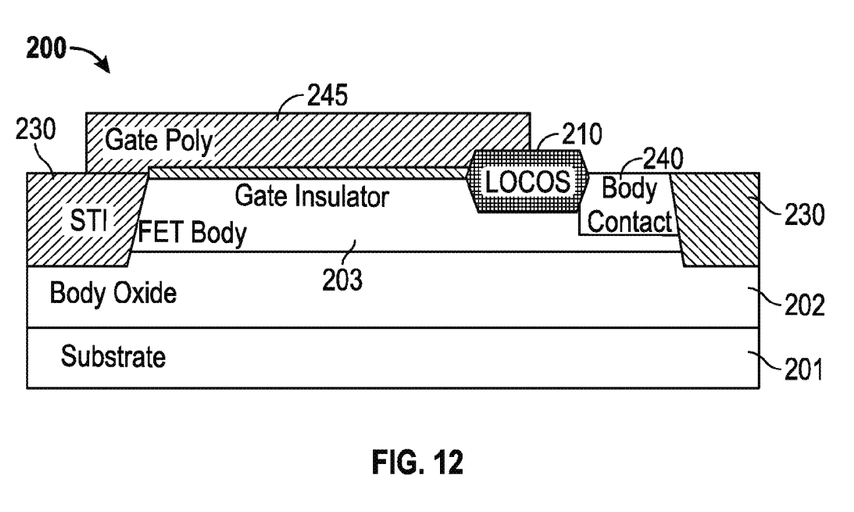

Referring now to FIG. 12, the gate electrode forming material will hereinafter be referred to, for convenience of description but without limitation, as polycrystalline silicon although those of skill in the art will recognize that other materials can also be used. The polycrystalline silicon can be deposited by CVD or LPCVD by the reduction of silane ($SiH_4$). A layer of hard mask material such as silicon oxide, silicon nitride, silicon oxynitride, or the like (not illustrated) can also be deposited over the layer of polycrystalline silicon to aid in the patterning and etching of the gate electrodes. The polycrystalline silicon layer can be patterned using a patterned photoresist layer and conventional photolithography techniques and plasma etching in a Cl or $HBr/O_2$ chemistry. In a preferred embodiment of the disclosure, sidewall spacers are also formed. The sidewall spacers can be formed by anisotropically etching a layer of silicon oxide, silicon nitride, or the like in well-known manner. The layer of spacer forming material is anisotropically etched, for example by reactive ion etching (RIE) using a $CHF_3$, $CF_4$, or $SF_6$ chemistry to remove the layer from substantially horizontal surfaces (the tops of the polycrystalline silicon features) and to leave the layer on substantially vertical surfaces (the sidewalls of the polycrystalline silicon features).

More particularly, to form the gate structure 245, a photoresist mask is formed over the polysilicon layer, and an etch is performed through the openings of this gate mask. This etch defines the gate electrode 245 of transistor 200. The remaining portion of etched polysilicon region forms the gate electrode 245 of transistor 200.

Source/drain implants are performed to create lightly doped source/drain regions. Dielectric sidewall spacers are then formed adjacent to the gate electrode 245. An N+ implant is performed to create source/drain contact regions 241-242 and n-body contact region 240. Metal salicide regions are formed over the resulting structure using a conventional salicide process. A standard CMOS process is used to form the remaining backend structures (e.g., contacts, metals and vias), which are not shown for the sake of simplicity of description.

As such, various embodiments of an SOI integrated circuit with local oxidation of silicon and methods for fabricating the same have been provided. It will be appreciated that the described embodiments significantly reduce parasitic capacitance as compared to conventional SOI structures. Further, the process to fabricate the described integrated circuits is fully compatible with existing process modules. As such, various new integrated circuits designs incorporating the described structure can easily and inexpensively be realized.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. An integrated circuit comprising:
    a semiconductor substrate;
    a plurality of shallow trench isolation (STI) regions, each extending at least a first depth below an upper surface of the semiconductor substrate, wherein the STI regions electrically isolate devices fabricated in the semiconductor substrate; and
    a transistor comprising:
        source and drain regions located in the semiconductor substrate;
        a gate dielectric layer located between the source and drain regions;
        a local oxide layer located in a second portion of the semiconductor substrate and extending a second depth below the upper surface of the semiconductor substrate, wherein the first depth is greater than the second depth; and
        a gate electrode that extends over the gate dielectric layer and the local oxide layer, wherein the gate electrode is in direct abutting contact with the local oxide layer with respect to an entirety of an area of the local oxide layer over which the gate electrode extends.

2. The integrated circuit of claim 1, wherein the semiconductor substrate is a silicon-on-insulator substrate.

3. The integrated circuit of claim 1, wherein the gate electrode has a length and a width, and wherein the length of the gate electrode is greater than the width of the gate electrode.

4. The integrated circuit of claim 3, wherein the local oxide layer has a length and a width, and wherein the length of the local oxide layer is greater than the width of the local oxide layer.

5. The integrated circuit of claim 4, wherein the length of the gate electrode extends perpendicular to the length of the local oxide layer.

6. The integrated circuit of claim 4, wherein the local oxide layer extends above the upper surface of the semiconductor substrate.

7. The integrate circuit of claim 4, wherein the source region has a length and a width, wherein the length of the source region is greater than the width of the source region, and wherein the length of the source region extends parallel to the length of the gate electrode, and wherein the source region is positioned on a first side of the gate electrode with respect to a lengthwise axis of the gate electrode.

8. The integrated circuit of claim 7, wherein the drain region has a length and a width, wherein the length of the drain region is greater than the width of the drain region, and wherein the length of the drain region extends parallel to the length of the gate electrode, and wherein the drain region is positioned on a second side of the gate electrode, opposite the first side of the gate electrode, with respect to the lengthwise axis of the gate electrode.

9. The integrated circuit of claim 8, further comprising a body contact region, wherein the source region and the drain region are positioned on a first side of the local oxide layer with respect to a lengthwise axis of the local oxide layer, and wherein the body contact region is positioned on a second side of the local oxide layer, opposite of the first side of the local oxide layer, with respect to the lengthwise axis of the local oxide layer.

10. The integrated circuit of claim 9, wherein the body contact region has a length and a width, wherein the length of the body contact region is greater than the width of the body contact region, wherein the length of the body contact region extends parallel to the length of the local oxide layer, and wherein the body contact region is in direct and abutting contact with the local oxide layer.

11. The integrated circuit of claim 9, wherein the source, the drain, and the body contact region extend a third depth below the upper surface of the semiconductor substrate, and wherein the third depth is less than the first depth but greater than the second depth.

12. The integrated circuit of claim 1, wherein the gate electrode further extends over a portion of one of the plurality of STI regions.

13. The integrated circuit of claim 12, wherein both the source and the drain regions are adjacent to the one of the plurality of STI regions.

14. The integrated circuit of claim 12, wherein both the source and the drain regions are adjacent to the local oxide layer.

15. The integrated circuit of claim 12, wherein the gate dielectric layer extends between the local oxide layer and the one of the plurality of STI regions.

16. A method of fabricating an integrated circuit comprising the steps of:
    forming a plurality of shallow trench isolation (STI) regions in a semiconductor substrate, each extending at least a first depth below an upper surface of the semiconductor substrate;
    forming a gate dielectric layer over a first portion of source and drain regions of the semiconductor substrate;
    oxidizing a second portion of the semiconductor substrate, thereby forming a local oxide region that extends a second depth below an upper surface of the semiconductor substrate, wherein the first depth is greater than the second depth; and forming a gate electrode over the gate dielectric layer and the local oxide region, wherein forming the gate electrode comprises forming the gate electrode so as to be in direct abutting contact with the local oxide layer with respect to an entirety of an area of the local oxide layer over which the gate electrode extends.

17. The method of claim 16, wherein forming the plurality of STI regions comprises etching a plurality of trench regions in the semiconductor substrate and depositing a silicon oxide material in the plurality of trenches.

18. The method of claim 16, wherein oxidizing the second portion of the semiconductor substrate comprises thermally oxidizing the second portion of the semiconductor substrate, wherein oxidizing the second portion of the semiconductor substrate further comprises forming the local oxide region in direct and abutting contact with a body contact region of the semiconductor substrate, and wherein oxidizing the second portion of the semiconductor substrate further comprises forming the local oxide region such that the source region and the drain region are positioned on a first side of the local oxide region with respect to a lengthwise axis of the local oxide region, and such that the body contact region is positioned on a second side of the local oxide region, opposite of the first side of the local oxide layer, with respect to the lengthwise axis of the local oxide region.

19. The method of claim 18, wherein forming the gate electrode comprises depositing and etching a polycrystalline silicon layer, wherein forming the gate electrode further comprises positioning the gate electrode such that the source region is positioned on a first side of the gate electrode with respect to a lengthwise axis of the gate electrode, wherein forming the gate electrode further comprises positioning the gate electrode such that the drain region is positioned on a second side of the gate electrode, opposite the first side of the gate electrode, with respect to the lengthwise axis of the gate electrode.

20. An integrated circuit comprising:
a silicon-on-insulator semiconductor substrate;
a plurality of shallow trench isolation (STI) regions, each extending into a buried oxide layer of the silicon-on-insulator semiconductor substrate, wherein the STI regions electrically isolate devices fabricated in the semiconductor substrate; and
a transistor comprising:
source and drain regions located in the semiconductor substrate;
a gate dielectric layer located between the source and drain regions;
a local oxide layer located in a second portion of the semiconductor substrate and extending a depth below and a height above the upper surface of the semiconductor substrate; and
a gate electrode that extends over the gate dielectric layer and the local oxide layer, wherein the gate electrode and the local oxide layer are disposed in a T-shaped configuration, and wherein the gate electrode is in direct abutting contact with the local oxide layer with respect to an entirety of an area of the local oxide layer over which the gate electrode extends; and
a body contact region disposed adjacent to the local oxide layer of the transistor.

* * * * *